United States Patent
Worledge

(10) Patent No.: US 10,083,730 B1
(45) Date of Patent: *Sep. 25, 2018

(54) THERMALLY-ASSISTED SPIN TRANSFER TORQUE MEMORY WITH IMPROVED BIT ERROR RATE PERFORMANCE

(71) Applicant: International Business Machines Corporation, Armonk, NY (US)

(72) Inventor: Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/794,425

(22) Filed: Oct. 26, 2017

Related U.S. Application Data

(63) Continuation of application No. 15/464,752, filed on Mar. 21, 2017.

(51) Int. Cl.
*G11C 11/16* (2006.01)
*H01L 27/22* (2006.01)
(Continued)

(52) U.S. Cl.
CPC ........ *G11C 11/1675* (2013.01); *G11C 11/161* (2013.01); *H01L 27/228* (2013.01);
(Continued)

(58) Field of Classification Search
CPC .................. G11C 11/161; G11C 11/1675
See application file for complete search history.

(56) References Cited

U.S. PATENT DOCUMENTS

2008/0291721 A1* 11/2008 Apalkov ............. G11C 11/1675
365/173
2010/0134923 A1* 6/2010 Clinton .................. G11C 11/161
360/131
(Continued)

OTHER PUBLICATIONS

D. Worledge, "Thermally-Assisted Spin Transfer Torque Memory With Improved Bit Error Rate Performance," U.S. Appl. No. 15/464,752, filed Mar. 21, 2017.

*Primary Examiner* — Hoai V Ho
*Assistant Examiner* — Jay Radke
(74) *Attorney, Agent, or Firm* — Cantor Colburn LLP; Vazken Alexanian

(57) ABSTRACT

Embodiments of the invention are directed to a magnetic tunnel junction (MTJ) storage element having a reference layer formed from a reference layer material having a fixed magnetization direction, along with a free layer formed from a free layer material having a switchable magnetization direction. The MTJ is configured to receive a write pulse having a write-pulse and spin-transfer-torque (WP-STT) start time, a WP-STT start segment duration and a write pulse duration. The WP-STT start segment duration is less than the write pulse duration. The fixed magnetization direction is configured to form an angle between the fixed magnetization direction and the switchable magnetization direction. The angle is sufficient to generate spin torque electrons in the reference layer material at the WP-STT start time. The spin torque electrons generated in the reference layer material is sufficient to initiate switching of the switchable magnetization direction at the WP-STT start time.

25 Claims, 5 Drawing Sheets

(51) Int. Cl.
*H01L 43/12* (2006.01)
*H01L 43/02* (2006.01)
*H01L 43/08* (2006.01)

(52) U.S. Cl.
CPC .............. *H01L 43/02* (2013.01); *H01L 43/08* (2013.01); *H01L 43/12* (2013.01)

(56) References Cited

U.S. PATENT DOCUMENTS

| | | | | |
|---|---|---|---|---|
| 2011/0007430 A1* | 1/2011 | Zheng | ................... | H01L 43/08 360/324.2 |
| 2011/0007560 A1* | 1/2011 | Dieny | ................... | B82Y 25/00 365/171 |

* cited by examiner

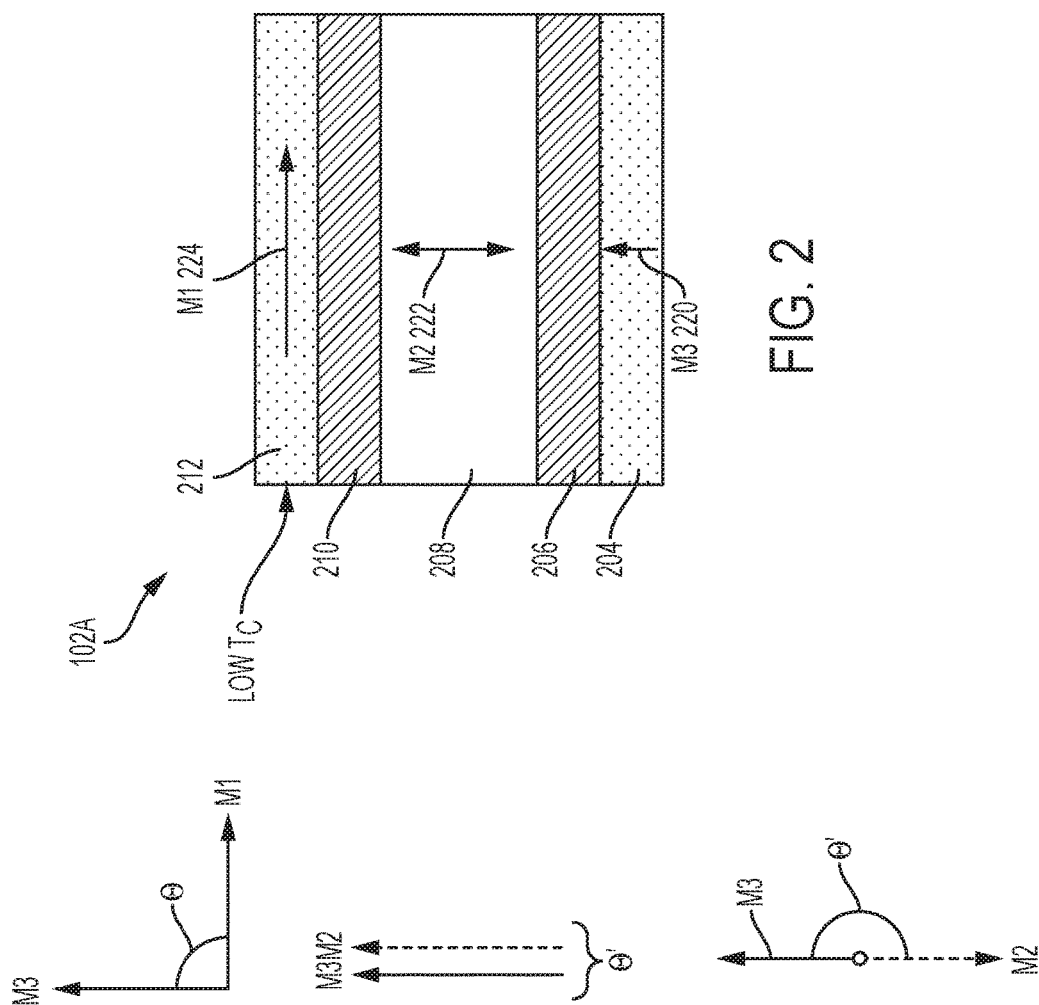

THERMALLY-ASSISTED SPIN TRANSFER TORQUE MEMORY WITH IMPROVED BIT ERROR RATE PERFORMANCE

DOMESTIC PRIORITY

This application is a continuation of U.S. application Ser. No. 15/464,752, filed Mar. 21, 2017, the contents of which are incorporated by reference herein in its entirety.

BACKGROUND

The present invention relates generally to electronic memory, and more specifically to spin transfer torque storage elements that provide improved bit error rate performance.

Electronic memory can be classified as volatile or non-volatile. Volatile memory retains its stored data only when power is supplied to the memory, but non-volatile memory retains its stored data without constant power. Volatile random access memory (RAM) provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. Data is stored in MRAM as magnetic states or characteristics (e.g., magnetization direction, magnetic polarity, magnetic moment, etc.) instead of electric charges. In a typical configuration, each MRAM cell includes a transistor, a magnetic tunnel junction (MTJ) device for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of certain MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism.

STT is a phenomenon that can be leveraged in MTJ-based storage elements to assist in switching the storage element from one storage state (e.g., "0" or "1") to another storage state (e.g., "1" or "0"). For example, STT-MRAM 100 shown in FIG. 1 uses electrons that have been spin-polarized to switch the magnetic state (i.e., the magnetization direction 110) of a free layer 108 of MTJ 102. The MTJ 102 is configured to include a reference/fixed magnetic layer 104, a thin dielectric tunnel barrier 106 and a free magnetic layer 108. The MTJ 102 has a low resistance when the magnetization direction 110 of its free layer 108 is parallel to the magnetization direction 112 of its fixed layer 104. Conversely, the MTJ 102 has a high resistance when its free layer 108 has a magnetization direction 110 that is oriented anti-parallel to the magnetization direction 112 of its fixed layer 104. STT-MRAM 100 includes the multi-layered MTJ 102 in series with the FET 120, which is gated by a word line (WL) 124. The BL 126 is coupled to the MTJ 102, and the SL 128 is coupled to the FET 120. The MTJ 102 (which is one of multiple MTJ storage elements along the BL 126) is selected by turning on its WL 124.

The MTJ 102 can be read by activating its associated word line transistor (e.g., field effect transistor (FET) 120), which switches current from a bit line (BL) 126 through the MTJ 102. The MTJ resistance can be determined from the sensed current, which is itself based on the polarity of the magnetization direction 110 of the free layer 108. Conventionally, if the magnetization direction 112 of the fixed layer 104 and the magnetization direction 110 of the free layer 108 have the same polarities, the resistance is low and a "0" is read. If the magnetization direction 112 of the fixed layer 104 and the magnetization direction 110 of the free layer 108 have opposite polarities, the resistance is higher and a "1" is read.

When a voltage (e.g., 500 mV) is forced across the MTJ 102 from the BL 126 to the SL 128, current flows through the selected cell's MTJ 102 to write it into a particular state, which is determined by the polarity of the applied voltage (BL high vs. SL high). During the write operation, spin-polarized electrons generated in the reference layer 104 tunnel through the tunnel layer 106 and exert a torque on the free layer 108, which can switch the magnetization direction 110 of the free layer 108. Thus, the amount of current required to write to a STT-MRAM MTJ depends on how efficiently spin polarization is generated in the MTJ. Additionally, STT-MRAM designs that keep write currents small (e.g., $I_c$<25 micro-ampere) are important to improving STT-MRAM scalability. This is because a larger switching current would require a larger transistor (e.g., FET 120), which would inhibit the ability to scale up STT-MRAM density.

STT-MRAM technologies have been proposed to reduce the switching current by improving or increasing the generation of spin torque electrons. For example, it is more difficult to change the magnetization direction of the MTJ free layer at a normal operating temperature. Accordingly, so-called "thermally-assisted" or "thermoelectric" STT-MRAM has been developed that uses the application of heat to reduce the required switching current. In a known configuration, the thermally-assisted STT-MRAM includes a MTJ and a tunnel junction programming circuit. The MTJ includes a reference layer having a fixed magnetization direction, a tunnel barrier layer, and a free layer on an opposite side of the tunnel barrier layer from the reference layer. The free layer includes a first layer having a first Curie temperature and a second layer having a second Curie temperature different from the first Curie temperature. A material's Cure temperature is the temperatures at which the material becomes nonmagnetic. The tunnel junction programming circuit is configured to apply a current through the MTJ to generate a write temperature in the MTJ and assist in writing (i.e., switching) the magnetization direction of the MTJ free layer.

Another consideration in STT-MRAM is the bit error rate (BER). In digital transmissions, the number of bit errors is the number of data stream bits received over a communication channel that have been altered due to noise, interference, distortion or bit synchronization errors. The BER is defined generally as the number of bit errors per unit time. The basic mechanisms that contribute to the BER of a given STT-MRAM design include thermal disturbance, read disturbance, and probabilistic write failure. The write process of a spin torque MTJ storage element is inherently stochastic due to thermal fluctuations, which give rise to a distribution of the magnetization of the free layer before and during switching. As a result, the time taken by the spin torque MTJ to switch can have a wide distribution. Therefore, there will be a non-zero probability that when a finite duration write pulse is turned off the spin torque MTJ will not have been written, which results in a so-called write error. The probability that a write error takes place for a given applied current pulse of a given length is known as the write error rate (WER). It has been estimated that correct operation of an STT-MRAM array can require that the WER is less than $10^{-9}$ if there is an error correction circuit (ECC) in the chip. This means that if $10^9$ write pulses are applied, the MTJ reliably writes all but one (1). If there is no ECC, it has been estimated that the WER needs to be less than $10^{-19}$.

Returning now to the concept of STT, the spin torque that is applied to the MTJ free layer is proportional to the sine of θ, where θ is the angle between the free layer magnetization direction and the reference layer magnetization direction. In a zero temperature environment, when the STT-MRAM switching process starts, there is no spin torque because θ is equal to zero (0) degrees (i.e., the magnetization directions of the fixed and free layers are parallel) or 180 degrees (i.e., the magnetization directions of the fixed and free layers are anti-parallel), and the sine of zero (0) degrees or 180 degrees is zero (0). In practice, however, there typically exists a very small but finite temperature that fluctuates by very small amounts. The very small fluctuations in temperature oscillate the free layer back and forth by a very small amount. Thus, in practice, the sine θ term at the start of the write process is not precisely zero (0) but is still very small and not sufficient to generate spin torque electrons in the fixed layer. However, in a thermally-assisted STT-MRAM, as the write current raises the MTJ temperature the free layer magnetization direction begins to change, and the sine θ term ramps up to become increasingly larger. After a period of time (e.g., about 1 nanosecond (ns)), the θ term is sufficiently large to generate sufficient spin torque to begin the process of switching the free layer magnetization direction. This spin torque ramp up period, which is inherent to known STT-MRAM configurations, results in inherent switching delays that can increase the WER. Accordingly, a contributing factor to WER in thermally-assisted MTJ storage elements is that no or insufficient spin torque is generated at the start of the write operation because sine θ, at the start of a write operation and for a period of time thereafter, is either zero (0) or very close to zero (0).

SUMMARY

Embodiments of the invention are directed to a magnetic tunnel junction (MTJ) storage element. In a non-limiting example, the MTJ includes a reference layer formed from a reference layer material having a fixed magnetization direction, along with a free layer formed from a free layer material having a switchable magnetization direction. The MTJ is configured to receive a write pulse having a write-pulse and spin-transfer-torque (WP-STT) start time, a WP-STT start segment duration and a write pulse duration. The WP-STT start segment duration is less than the write pulse duration. The fixed magnetization direction is configured to form an angle between the fixed magnetization direction and the switchable magnetization direction. The angle is sufficient to generate spin torque electrons in the reference layer material at the WP-STT start time. Advantages of the above-described embodiments of the invention include, but are not limited to, improved WER. More specifically, because the above-described embodiments of the present invention provide spin torque electrons from the start of the write pulse, the likelihood of a write error is less than that in spin torque MTJ configurations that do not provide spin torque electrons from the start of the write pulse. Accordingly, spin torque MTJ storage elements according to the above-described embodiments of the invention provide improved WER.

Embodiments of the invention are directed to a MTJ storage element. In a non-limiting example, the MTJ includes a first reference layer formed from a first reference layer material having a first fixed magnetization direction, along with a free layer formed from a free layer material having a switchable magnetization direction. The MTJ further includes a second reference layer formed from a second reference layer material having a second fixed magnetization direction. The MTJ is configured to receive a write pulse having a WP-STT start time, a WP-STT start segment duration and a write pulse duration. The WP-STT start segment duration is less than the write pulse duration. The first fixed magnetization direction is configured to form a first angle between the first fixed magnetization direction and the switchable magnetization direction. The first angle is sufficient to generate spin torque electrons in the first reference layer material at the WP-STT start time. The spin torque electrons generated in the first reference layer material is sufficient to initiate a process of switching the switchable magnetization direction at the WP-STT start time. The second fixed magnetization direction is configured to form a second angle between the second fixed magnetization direction and the switchable magnetization direction. The second angle is substantially insufficient to generate spin torque electrons in the second reference layer material at the WP-STT start time. Advantages of the above-described embodiments of the invention include, but are not limited to, improved WER performance. More specifically, because the above-described embodiments of the present invention provide spin torque electrons from the start of the write pulse, as well as a handoff process to complete the write operation, the likelihood of a write error is less than in spin torque MTJ configurations that do not provide spin torque electrons from the start of the write pulse. Accordingly, spin torque MTJ storage elements according to the above-described embodiments of the invention provide improved WER performance.

Embodiments of the invention are directed to a MTJ storage element. In a non-limiting example, the MTJ includes a first reference layer formed from a first reference layer material having a first fixed magnetization direction and a predetermined Curie temperature, along with a free layer formed from a free layer material having a switchable magnetization direction. The MTJ further includes a second reference layer formed from a second reference layer material having a second fixed magnetization direction. The MTJ storage element is configured to receive a WP-STT start time, a WP-STT start segment duration and a write pulse duration. The WP-STT start segment duration is less than the write pulse duration. The MTJ storage element and the write pulse are configured to initiate a process of imparting Joule heating to the MTJ storage element when the write pulse is applied to the MTJ storage element at the WP-STT start time. The Joule heating does not raise the temperature of the first reference layer above the predetermined Curie temperature during the WP-STT start segment duration. The first fixed magnetization direction is configured to form a first angle between the first fixed magnetization direction and the switchable magnetization direction. The first angle is sufficient to generate spin torque electrons in the first reference layer material at the WP-STT start time. The spin torque electrons generated in the first reference layer material is sufficient to initiate a process of switching the switchable magnetization direction at the WP-STT start time. The second fixed magnetization direction is configured to form a second angle between the second fixed magnetization direction and the switchable magnetization direction. The second angle is substantially insufficient to generate spin torque electrons in the second reference layer material at the WP-STT start time. Advantages of the above-described embodiments of the invention include, but are not limited to, improved WER performance. More specifically, because the above-described embodiments of the present invention provide spin torque electrons from the start of the write pulse, as well as a temperature-based handoff process to complete the write operation, the likelihood of a write error is less than in spin torque MTJ configurations that do not provide spin torque electrons from the start of the write pulse. Accordingly, spin torque MTJ storage elements according to the above-described embodiments of the invention provide improved WER performance.

Embodiments of the invention are directed to a method of operating a MTJ storage element. In a non-limiting example of the method, the MTJ storage element includes a reference layer and a free layer. The reference layer includes a reference layer material having a fixed magnetization direction, and the free layer includes a free layer material having a switchable magnetization direction. The method includes receiving a write pulse at the MTJ storage element to generate spin torque electrons. The write pulse includes a WP-STT start time, a WP-STT start segment duration and a write pulse duration. The WP-STT start segment duration is less than the write pulse duration. The fixed magnetization direction is configured to form an angle between the fixed magnetization direction and the switchable magnetization direction. The angle is sufficient to generate, based at least in part on receiving the write pulse, the spin torque electrons in the reference layer material at the WP-STT start time. The method further includes initiating, based at least in part on the spin torque electrons generated in the reference layer material, a process of switching the switchable magnetization direction at the WP-STT start time. Advantages of the above-described embodiments of the invention include, but are not limited to, improved WER performance. More specifically, because the above-described embodiments of the present invention provide spin torque electrons from the start of the write pulse, the likelihood of a write error is less than in spin torque MTJ configurations that do not provide spin torque electrons from the start of the write pulse. Accordingly, spin torque MTJ storage elements according to the above-described embodiments of the invention provide improved WER performance.

Embodiments of the invention are directed to a method of forming a MTJ storage element. In a non-limiting example, the method includes forming a first reference layer, a second reference layer, and a free layer between the first reference layer and the second reference layer. The method further includes forming the first reference layer from a first reference layer material having a first fixed magnetization direction. The method further includes forming the free layer from a free layer material having a switchable magnetization direction. The method further includes forming the second reference layer from a second reference layer material having a second fixed magnetization direction. The method further includes configuring the MTJ to receive a WP-STT start time, a WP-STT start segment duration and a write pulse duration. The WP-STT start segment duration is less than the write pulse duration. The method further includes configuring the first fixed magnetization direction to form a first angle between the first fixed magnetization direction and the switchable magnetization direction. The first angle is sufficient to generate spin torque electrons in the first reference layer material at the WP-STT start time. The spin torque electrons generated in the first reference layer material is sufficient to initiate a process of switching the switchable magnetization direction at the WP-STT start time. The method further includes configuring the second fixed magnetization direction to form a second angle between the second fixed magnetization direction and the switchable magnetization direction. The second angle is substantially insufficient to generate spin torque electrons in the second reference layer material at the WP-STT start time. Advantages of the above-described embodiments of the invention include, but are not limited to, improved WER performance. More specifically, because the above-described embodiments of the present invention provide spin torque electrons from the start of the write pulse, the likelihood of a write error is less than in spin torque MTJ configurations that do not provide spin torque electrons from the start of the write pulse. Accordingly, spin torque MTJ storage elements according to the above-described embodiments of the invention provide improved WER performance.

Additional features and advantages are realized through the techniques of the present invention. Other embodiments and aspects of the invention are described in detail herein and are considered a part of the claimed subject matter. For a better understanding, refer to the description and to the drawings.

BRIEF DESCRIPTION OF THE DRAWINGS

The diagrams depicted herein are illustrative. There can be many variations to the diagram or the operations described therein without departing from the spirit of the invention. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the specification.

The subject matter of the invention is particularly pointed out and distinctly claimed in the claims at the conclusion of the specification. The foregoing and other features and advantages are apparent from the following detailed description taken in conjunction with the accompanying drawings in which:

FIG. 2 depicts a block diagram of a thermally-assisted spin torque MTJ configured according to embodiments of the present invention;

DETAILED DESCRIPTION

Figure 1:
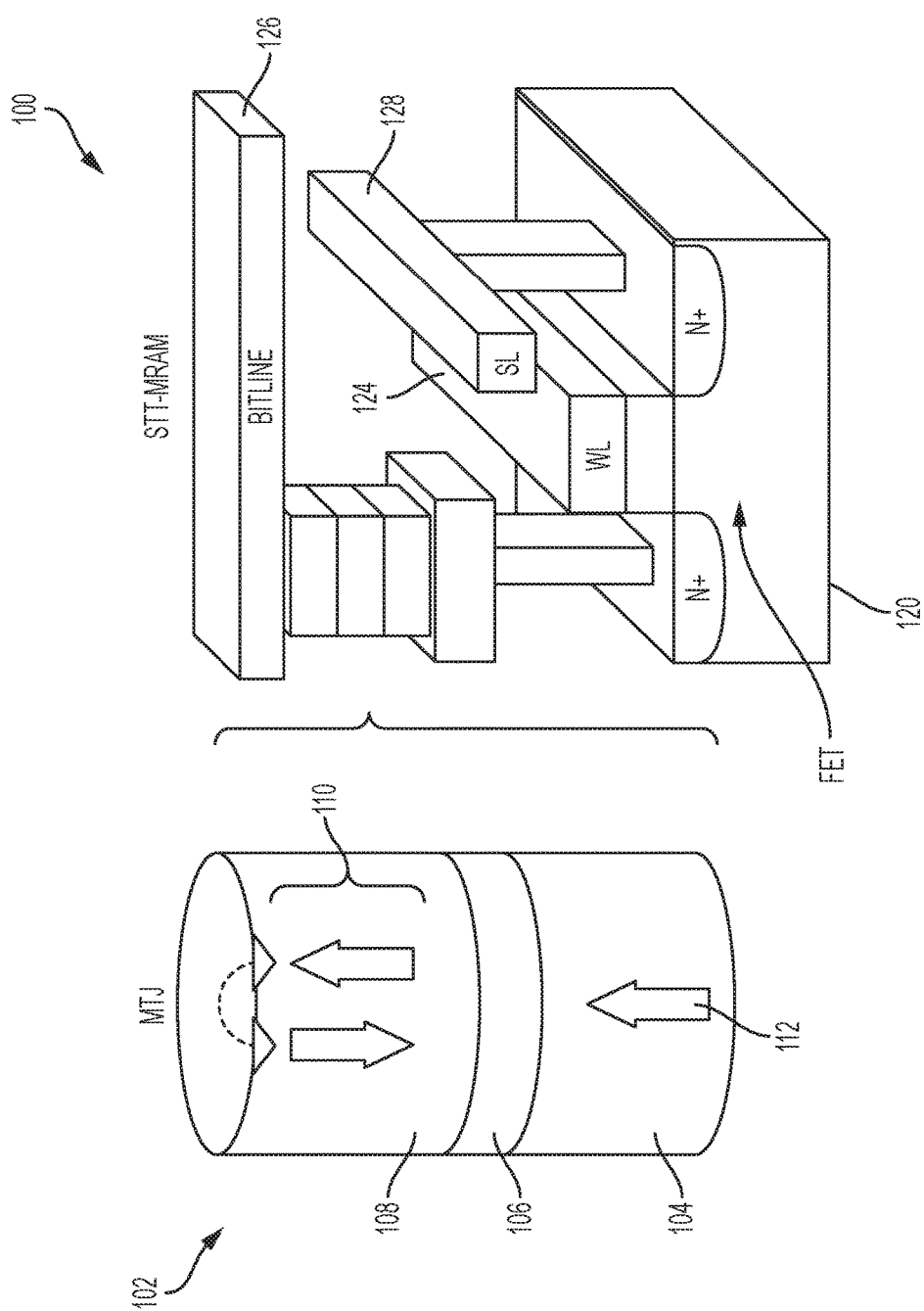
FIG. 1 depicts a block diagram of a STT-MRAM capable of utilizing a thermally-assisted spin torque MTJ storage element configured according to embodiments of the present invention.

Various embodiments of the present invention are described herein with reference to the related drawings. Alternative embodiments of the invention can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For the sake of brevity, conventional techniques related to MTJ fabrication may or may not be described in detail herein. Moreover, the various tasks and process steps described herein can be incorporated into a more comprehensive procedure or process having additional steps or functionality not described in detail herein. In particular, various steps in the manufacture of STT-MRAM and MTJ devices are well known and so, in the interest of brevity, many conventional steps are only mentioned briefly herein or are omitted entirely without providing the well-known process details.

As previously described herein, in STT-MRAM, the spin torque that is applied to the free layer is proportional to the sine of θ, where θ is the angle between the free layer magnetization direction and the reference layer magnetization direction. In a zero temperature environment, when the STT-MRAM switching process starts, there is no spin torque because θ is equal to zero (0) degrees (i.e., the magnetization directions of the fixed and free layers are parallel) or 180 degrees (i.e., the magnetization directions of the fixed and free layers are anti-parallel), and the sine of zero (0) degrees or 180 degrees is zero (0). In practice, however, thermal fluctuations typically move the free layer magnetization by very small amounts. The thermal fluctuations oscillate the free layer back and forth by a very small amount. Thus, in practice, the sine θ term at the start of the write process is not precisely zero (0) so spin torque switching can occur as long as a thermal fluctuation comes along when the switching current is applied. However, occasionally, no thermal fluctuations come along and in that case sin θ is zero (0), and so the bit does not switch. This spin torque incubation period, which is inherent to known STT-MRAM configurations, results in inherent switching delays that can increase the WER. Accordingly, a contributing factor to WER in thermally-assisted MTJ storage elements is that no or insufficient spin torque is generated at the start of the write operation because sine θ, at the start of a write operation and for a period of time thereafter, is either zero (0) or very close to zero (0).

Turning now to an overview of aspects of the invention, embodiments of the invention address the above-described WER shortcomings by providing novel configurations, fabrication methods, and operation methods for the MTJ storage element of a STT-MRAM, which, in some embodiments, is a thermally assisted STT-MRAM. In an example embodiment of the invention, a bottom tunnel barrier is provided between a bottom reference/fixed layer and a free layer. A top tunnel barrier is provided over the free layer, and a top reference/fixed layer is provided over the top tunnel barrier. In embodiments of the invention, the symbol θ identifies the angle between the free layer magnetization direction and the top reference/fixed layer magnetization direction, and the symbol θ' identifies the angle between the free layer magnetization direction and the bottom reference/fixed layer magnetization direction.

According to aspects of the invention, the top reference/fixed layer's magnetization direction is set such that the angle θ is at neither zero (0) degrees nor one hundred and eighty (180) degrees. In some embodiments of the invention, the top reference/fixed layer's magnetization direction is set such that the angle θ is sufficiently large to produce spin torque electrons in the top reference/fixed layer at the start of a write operation, thus improving WER performance. In some embodiments of the invention, the top reference/fixed layer's magnetization direction is substantially in-plane with the respect to the top reference/fixed layer and substantially perpendicular with respect to the free layer's magnetization direction. Because the top reference/fixed layer's magnetization direction is substantially perpendicular with respect to the free layer's magnetization direction, the angle θ is an example of an angle θ that is sufficiently large to produce spin torque electrons in the top reference/fixed layer at the start of a write operation, thus improving WER performance. In some embodiments of the invention, the spin torque electrons generated in the top reference/fixed layer begin the process of switching the free layer's magnetization direction by tunneling through a top tunnel barrier into the free layer.

As the free layer's magnetization direction continues to switch under the influence of spin torque electrons from the top reference/fixed layer, the angle θ', which is the angle between the free layer magnetization direction and the bottom reference/fixed layer magnetization direction, increases. At a handoff time (e.g., 1 ns) after the start of the write operation, the angle θ' is sufficiently large to produce enough spin torque electrons in the bottom reference/fixed layer that the bottom reference/fixed layer is now switching the free layer's magnetization direction. During the portion of the write pulse after the handoff time, the bottom reference/fixed layer completes the process of switching the free layer's magnetization direction. Because embodiments of the present invention provide spin torque electrons from the start of the write pulse, the likelihood of a write error is less than in spin torque MTJ configurations that do not provide spin torque electrons from the start of the write pulse. Accordingly, spin torque MTJ storage elements according to embodiments of the invention provide improved WER performance.

It is contemplated that handing the primary influence on the free layer's magnetization direction off to the bottom reference/fixed layer can be implemented in a variety of ways that would fall within the scope of the present invention. In some embodiments of the invention, the hand off can be executed in the following manner. The top reference/fixed layer can be provided with a low Tc (i.e., Curie temperature) of about 150 Celsius degrees. As previously noted herein, a material's Curie temperature is the temperature at which the material becomes nonmagnetic or de-magnetized. When the write pulse is first applied, the Joule heating from the applied current has not generated enough heat to raise the MTJ the storage element's temperature above 150 Celsius. Therefore, up to the handoff time (e.g., the first one (1) ns of a ten (10) ns write pulse), the top reference/fixed layer remains magnetic and applies spin torque to the free layer to efficiently move the free layer's magnetization direction to be parallel with the top reference/fixed layer's magnetization direction. At the handoff time (e.g., about one (1) ns), the Joule heating from the applied current heats the MTJ's storage element above 150 Celsius, which makes the top reference/fixed layer nonmagnetic. When the top reference/fixed layer is nonmagnetic, the generation of spin torque electrons in the top reference/fixed layer ceases.

The angle $\theta'$ is at or near zero at the start of the write pulse. Accordingly, at the start of the write pulse, the angle $\theta'$ starts at or near zero. As the top reference layer continues to the process of switching the free layer magnetization direction, the angle $\theta'$ increases over time. By about the handoff time (e.g., about one (1) ns), the angle $\theta'$ has become sufficiently large to produce enough spin torque electrons in the bottom reference/fixed layer that the bottom reference/fixed layer can take over switching the free layer's magnetization direction when the top reference/fixed layer becomes nonmagnetic and the spin torque from the top reference/fixed layer ceases. During the portion of the write pulse after the handoff time, the bottom reference/fixed layer completes the process of switching the free layer's magnetization direction. Accordingly, in contrast to known STT-MRAM, methods and structures of the invention generate sufficient spin torque electrons to begin switching the free layer magnetization direction from the very beginning of the write pulse, thus improving WER performance.

In some embodiments of the invention, the above-described characteristics and roles of the top reference layer and the bottom reference layer can be reversed.

Turning now to a more detailed description of aspects of the present invention, FIG. 2 depicts a block diagram illustrating an example configuration of a thermally-assisted spin torque MTJ-based storage element 102A according to embodiments of the present invention. The MTJ 102A can be implemented in the STT-MRAM 100 (shown in FIG. 1) in the same manner as the MTJ 102. The MTJ 102A includes a bottom magnetic reference layer 204 (e.g., Fe, CoFe, CoFeB, etc.), a bottom dielectric tunnel barrier 206 (e.g., MgO), a free magnetic layer 208 (e.g., Fe, CoFe, CoFeB, etc.), a top dielectric tunnel barrier 210 (e.g., MgO), and a top magnetic reference layer 212 (e.g., Fe, CoFe, CoFeB, etc.), configured and arranged as shown. In some embodiments of the invention, the positions of the top reference layer 212 and the bottom reference layer 204 shown in FIG. 1 can be reversed.

The bottom magnetic reference layer 204 and the top magnetic reference layer 212 are formed and configured such that their respective magnetization directions 220, 224 are fixed. The free magnetic layer 208 is formed and configured in a manner that provides it with a switchable magnetization direction 222.

The top tunnel barrier layer 210 can be formed from a relatively thin (e.g., about 10 angstroms) layer of dielectric material (e.g., MgO). When two conducting electrodes (e.g., top reference/fixed layer 212 and free layer 208) are separated by a thin dielectric layer (e.g., top tunnel barrier layer 210), electrons can tunnel through the dielectric layer resulting in electrical conduction. The electron tunneling phenomenon arises from the wave nature of the electrons, and the resulting junction electrical conductance is determined by the evanescent state of the electron wave function within the tunnel barrier. Accordingly, the top tunnel barrier 210 is configured to be thin enough to allow electrons (specifically, spin torque electrons) from the top reference layer 212 to quantum mechanically tunnel through the top tunnel barrier 210. The top tunnel barrier 210 is also configured to be thick enough to decouple the free layer 208 from the top reference layer 212 such that the magnetization direction 222 of the free layer 208 is free to flip back and forth.

Similarly, the bottom tunnel barrier layer 206 can be formed from a relatively thin (e.g., about 10 angstroms) layer of dielectric material (e.g., MgO). The bottom tunnel barrier 206 is configured to be thin enough to allow electrons (specifically, spin torque electrons) from the bottom reference layer 204 to quantum mechanically tunnel through the bottom tunnel barrier 206. The bottom tunnel barrier 206 is also configured to be thick enough to decouple the free layer 208 from the bottom reference layer 204 such that the magnetization direction 222 of the free layer 208 is free to flip back and forth.

In the embodiment of the invention depicted in FIG. 2, the magnetization direction 224 of the top reference layer 212 is formed and configured to be substantially in-plane with the respect to the top reference layer 212 and substantially perpendicular with respect to the magnetization direction 222 of the free layer 208. Because the magnetization direction 224 of the top reference layer 212 is substantially perpendicular with respect to the magnetization direction 222 of the free layer 208, the top reference layer 212 is provided with an angle $\theta$, where $\theta$ is the angle between the free layer magnetization direction 222 and the top reference/fixed layer magnetization direction 224. A diagram showing a snapshot of the angle $\theta$ for the MTJ 102A at the start of the write operation is shown in FIG. 2. The angle $\theta$ is sufficiently large to generate enough spin torque electrons in the top reference layer 212 to tunnel through the top tunnel barrier 212 into the free layer 208 at the start of a write operation. In embodiments of the invention, the spin torque electrons generated in the top reference/fixed layer 212 by the angle $\theta$ are sufficient to begin switching the magnetization direction 222 of the free layer 208 at the very start of the write operation (i.e., at the very beginning of the write pulse), thus improving the WER performance. In some embodiments of the invention, the angle $\theta$ is selected to be neither zero (0) degrees nor one hundred and eighty (180) degrees. In some embodiments of the invention, the angle $\theta$ is selected be large enough to generate enough spin torque electrons generated in the top reference/fixed layer 212 to begin switching the magnetization direction 222 of the free layer 208 at the very start of the write operation (i.e., at the very beginning of the write pulse), thus improving the WER performance.

The previously described angle $\theta'$, which is the angle between the free layer magnetization direction 222 and the bottom reference/fixed layer magnetization direction 220, is at or near zero at the start of the write pulse. A diagram showing a snapshot of the angle $\theta'$ for the MTJ 102A at the start of the write operation is shown in FIG. 2. As the free layer's magnetization direction (M2) 222 continues to switch under the influence of spin torque electrons from the top reference/fixed layer 212, the angle $\theta'$ changes over time. At a handoff time (e.g., 1 ns) after the start of the write operation, the angle $\theta'$ has changed sufficiently to produce enough spin torque electrons in the bottom reference/fixed layer 204 that the bottom reference/fixed layer 204 is now switching the free layer's magnetization direction 222. During the portion of the write pulse after the handoff time, the bottom reference/fixed layer 204 completes the process of switching the free layer's magnetization direction 222. Because embodiments of the present invention provide spin torque electrons from the start of the write pulse, the likelihood of a write error is less than in spin torque MTJ configurations that do not provide spin torque electrons from the start of the write pulse. Accordingly, spin torque MTJ storage elements configured and operated according to embodiments of the invention (e.g., MTJ 102A) provide improved WER performance.

It is contemplated that handing the primary influence on the free layer's magnetization direction 222 off to the bottom reference/fixed layer 204 can be implemented in a variety of ways that would fall within the scope of the present invention. In some embodiments of the invention, the hand off can be executed in the following manner. The top reference/fixed layer 212 can be provided with a low Tc (i.e., Curie temperature) of about 150 Celsius degrees. As previously noted herein, a material's Curie temperature is the temperature at which the material becomes nonmagnetic or demagnetized. When the write pulse is first applied, the Joule heating from the applied current has not generated enough heat to raise the temperature of the MTJ 102A above 150 Celsius. Therefore, up to the handoff time (e.g., the first one (1) ns of a ten (10) ns write pulse), the top reference/fixed layer 212 remains magnetic and applies spin torque electrons to the free layer 208 to efficiently move the free layer's magnetization direction 222 to be parallel with the top reference/fixed layer's magnetization direction 224. At the handoff time (e.g., about one (1) ns), the Joule heating from the applied current heats the MTJ 102A above 150 Celsius, which makes the top reference/fixed layer 212 nonmagnetic. When the top reference/fixed layer 212 is nonmagnetic, the generation of spin torque electrons in the top reference/fixed layer 212 ceases.

Figure 3A:
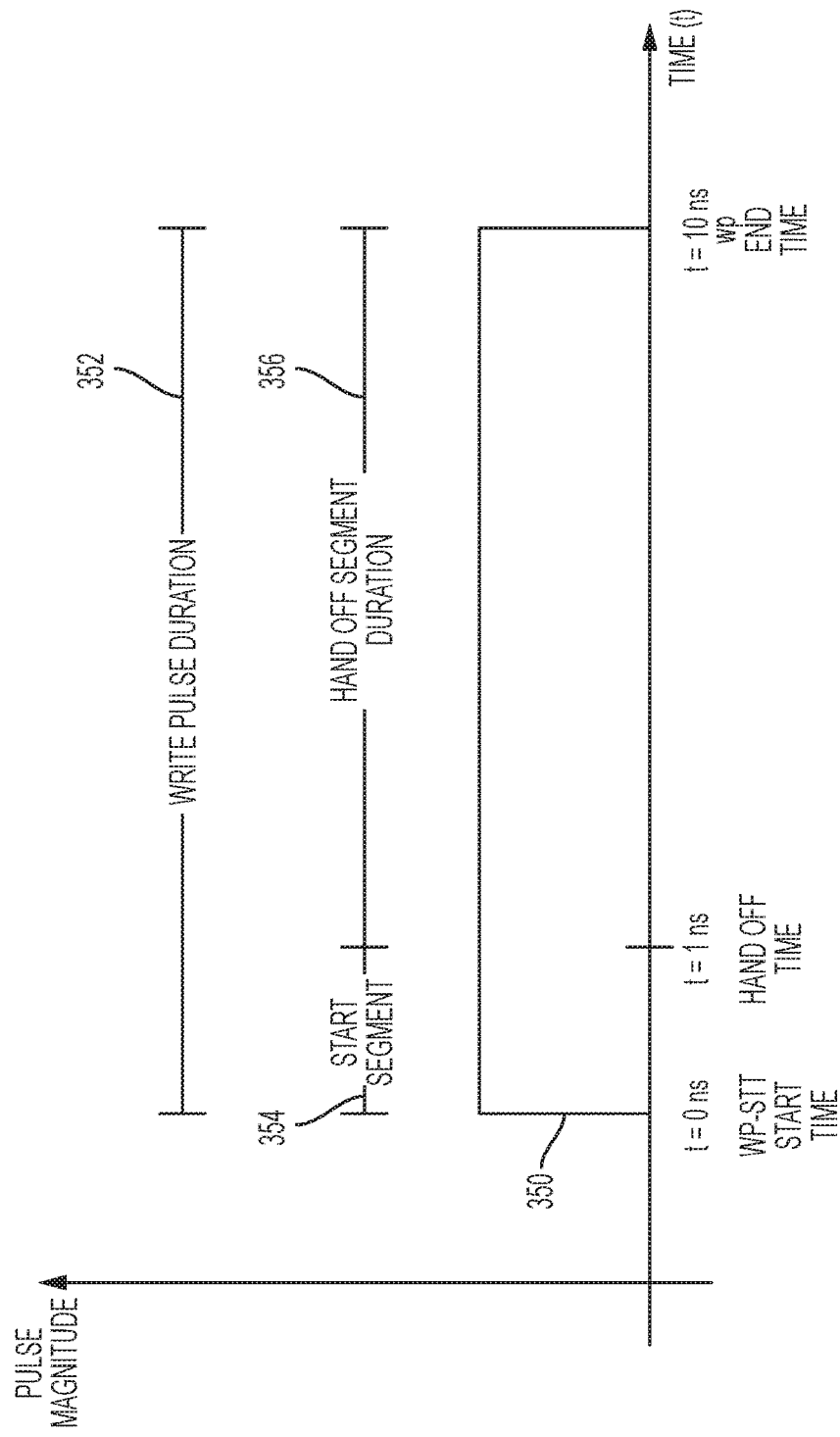
FIG. 3A depicts a various segments of write pulse that can be applied to a thermally-assisted spin torque MTJ configured according to embodiments of the invention.
Figure 3B:
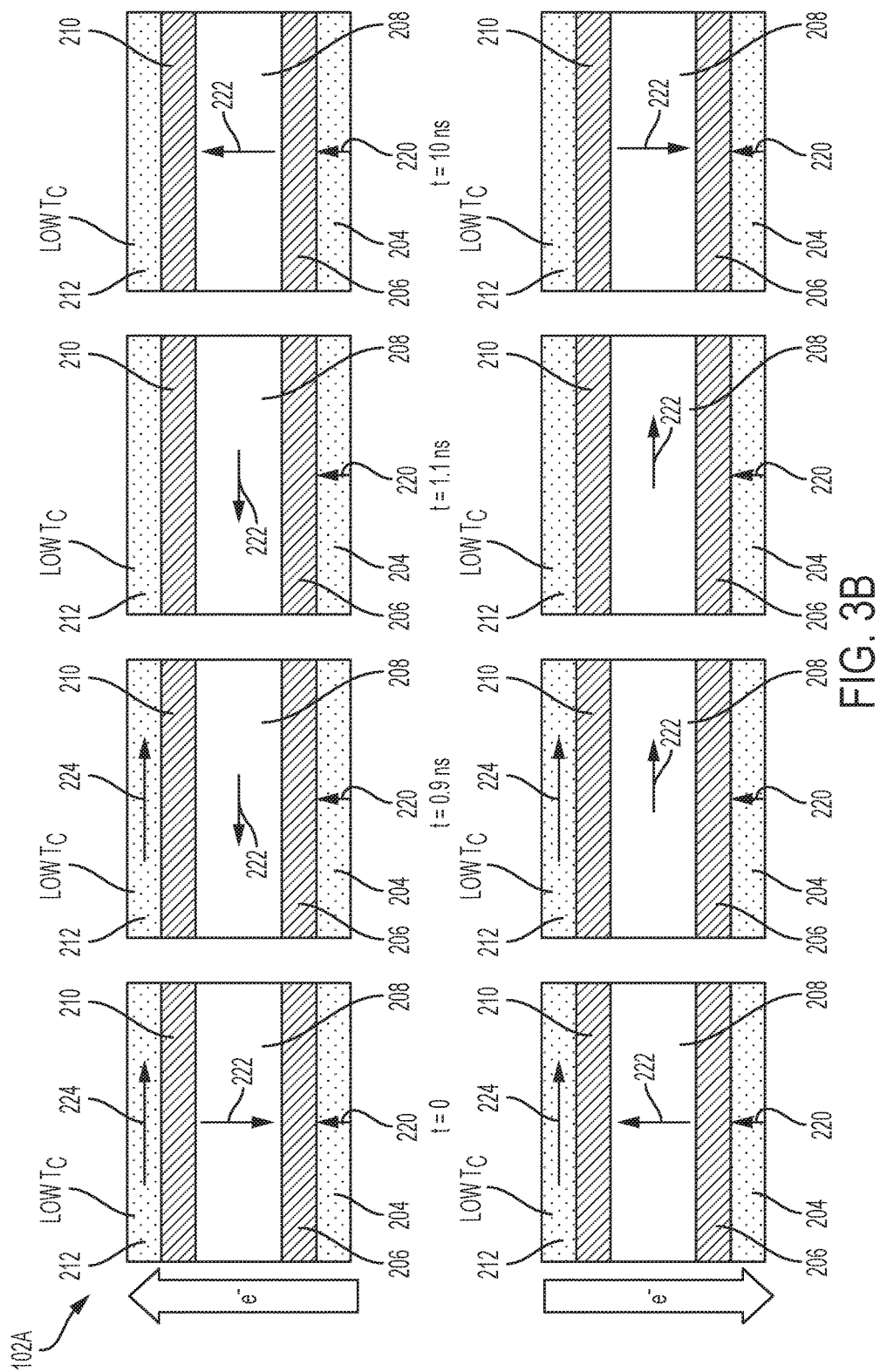
FIG. 3B depicts a sequence of diagrams illustrating a write operation of a thermally-assisted spin torque MTJ configured according to embodiments of the invention.

A write operation of the MTJ 102A will now be described with reference to FIGS. 3A and 3B. FIG. 3A depicts a diagram of a write pulse 350 according to embodiments of the invention. The write pulse 350 (shown in FIG. 3A) is applied to the MTJ 104A (shown in FIGS. 2 and 3B) and operates, according to embodiments of the invention, to change the magnetization direction 222 of the free layer 208 from pointing down to pointing up (or from pointing up to pointing down), thereby writing to the MTJ 104A. FIG. 3B depicts a sequence of diagrams illustrating how the magnetization directions 220, 222, 224 of the MTJ 102A change over time during the initial application of a write pulse (i.e., switching current) according to embodiments of the invention.

Turning initially to FIG. 3A, the write pulse 350 is depicted in a diagram/graph that shows how the magnitude (M) of the write pulse 350 changes over time (t). In the depicted embodiment, the write pulse 350 includes a write pulse duration 352 of about ten (10) nanoseconds, which itself includes a start segment duration 354 (about one (1) nanosecond) and a handoff segment duration 356 (about nine (9) nanoseconds). The write pulse 350 and the start segment duration 354 start at t=0, which is designated as the write-pulse and spin-transfer-torque (WP-STT) start time. The end of the start segment duration 354 is at the handoff time, which is shown in FIG. 3B at t=one (1) nanosecond. The handoff time marks the beginning of the handoff segment duration 356. The end of the handoff segment 356 and the end of the write pulse duration 352 are at the write pulse end time, which is shown in FIG. 3A at t=ten (10) nanoseconds.

FIG. 3B depicts a sequence of four diagrams along the top of FIG. 3B, where each diagram illustrates the magnetization directions 220, 222, 224 of the MTJ 102A at a particular time (t) and with an upward current direction (e−) during application of the write pulse 350 (shown in FIG. 3A). More specifically, the magnetization directions 220, 222, 224 of the MTJ 102A are depicted at t=zero (0) ns, t=0.9 ns, t=1.1 ns, and t=10 ns. Thus, the diagram at t=zero (0) depicts the magnetization directions 220, 222, 224 of the MTJ 102A at the WP-STT start time (shown in FIG. 3A). The diagram at t=0.9 ns depicts the magnetization directions 220, 222, 224 of the MTJ 102A just before the handoff time (t=one (1) ns, shown in FIG. 3A). The diagram at t=1.1 ns depicts the magnetization directions 220, 222, 224 of the MTJ 102A just after the handoff time (t=one (1) ns, shown in FIG. 3A). The diagram at t=10 ns depicts the magnetization directions 220, 222, 224 of the MTJ 102A at the write pulse end time (t=10 ns, shown in FIG. 3A).

Referring now to the sequence of diagrams shown along the top of FIG. 3B, the write pulse 350 (shown in FIG. 3A) is applied to the MTJ 104A and operates, according to embodiments of the invention, to change the magnetization direction 222 of the free layer 208 from pointing down to pointing up, thereby writing to the MTJ 104A. The diagram at t=zero (0) ns depicts the magnetization directions 220, 222, 224 of the MTJ 102A at the WP-STT start time (shown in FIG. 3A). At the WP-STT start time, the magnetization direction 222 of the free layer 208 is anti-parallel with respect to the magnetization direction 220 of the bottom reference layer 204. Accordingly, the angle θ between the magnetization direction 222 and the magnetization direction 220 is substantially zero (0), and the bottom reference layer 204 initially produces either no or an insufficient amount of spin torque electrons to switch the polarity of the free layer magnetization direction 222. In contrast, at the WP-STT start time, the magnetization direction 222 of the free layer 208 is substantially perpendicular with respect to the substantially in-plane magnetization direction 224 of the top reference layer 224. Accordingly, the angle θ between the magnetization direction 222 and the magnetization direction 224 is about 90 degrees, and the top reference layer 212 initially produces a sufficient amount of spin torque electrons to initiate a process of switching the polarity of the free layer magnetization direction 222.

As the above-described process of switching the direction of the free layer magnetization direction 222 continues, the angle θ' between the magnetization direction 222 and the magnetization direction 220 begins to change over time. Accordingly, although at the WP-STT start time the bottom reference layer 204 produces either no or insufficient spin torque electrons to switch the magnetization direction 222, at some point into the above-described process of switching the polarity of the free layer magnetization direction 222, the sine θ' value changes enough the bottom reference layer 204 begins to produce sufficient spin torque electrons to assist the above described process of switching the polarity of the free layer magnetization direction 222.

The diagram at t=0.9 ns depicts the magnetization directions 220, 222, 224 of the MTJ 102A just before the handoff time (t=one (1) ns, shown in FIG. 3A). At t=0.9 ns, the magnetization direction 222, under the influence of spin torque supplied by the top reference layer 212 and the bottom reference layer 204, has been switched to the position where it is substantially anti-parallel with respect to the magnetization direction 224 of the top reference layer 212, as well as substantially perpendicular with respect to the fixed magnetization direction 220. Thus, at t=0.9 ns, the top reference layer 212 is attempting to maintain an anti-parallel relationship between the magnetization direction 222 and the magnetization direction 224, and, at the same time, the bottom reference layer 204 is attempting to switch the magnetization direction 222 into a parallel relationship between the magnetization direction 222 and the magnetization direction 220.

Passing from t=0.9 ns to t=1.1 ns, the MTJ 104A passes through the handoff time, which is t=one (1) ns as shown in FIG. 3A. At the handoff time, the influence of the top reference layer 212 on the free layer magnetization direction 222 is removed, and the primary influence on the direction of the free layer magnetization direction 222 is handed off to the fixed magnetization direction 220 of the bottom reference layer 204.

In a non-limiting embodiment of the invention, the influence of the top reference layer 212 on the free layer magnetization direction 222 can be removed according to the following example methodology. The top reference layer 212 has been configured with a low Tc (i.e., Curie temperature) of, for example, about 150 Celsius degrees. As previously noted herein, a material's Curie temperature is the temperature at which the material becomes nonmagnetic. At about t=one (1) ns, the Joule heating from the write pulse 350 heats the MTJ 104A to above 150 Celsius, which makes the top reference layer 212 nonmagnetic. Hence, as depicted, at t=1.1 ns, the top reference layer 212 has been converted to nonmagnetic material, and the magnetization direction 224 of the top reference layer 212 has been removed.

At t=1.1 ns, the angle θ between the magnetization direction 222 and the magnetization direction 220 is about 90 degrees, and the bottom reference layer 204 now produces a sufficient amount of spin torque electrons to take over and complete the process of switching the polarity of the free layer magnetization direction 222. By t=10 ns, which is the end of the write pulse 350 (shown in FIG. 3A), the process of switching the polarity of the free layer magnetization direction 222 has been completed, the free layer magnetization direction 222 is substantially parallel with respect to the reference layer magnetization direction 220, and the write process is complete.

Using the switching methodologies of the present invention, the inherent WER of known STT-MRAM configurations is overcome by providing, at the very start of the write pulse 350, an angle θ between the free layer magnetization direction 222 and the magnetization direction 224 that produces from the very start of the write operation a sufficient amount of spin torque electrons to initiate a process of switching the polarity of the free layer magnetization direction 222. Because a primary cause of WER in known thermal STT-MRAM designs is that sine θ is either zero (0) or very close to zero (0) at the start of the spin torque switching, the switching methodologies of the present invention address and improve (i.e., decrease) the inherent WER of known STT-MRAM configurations.

FIG. 3B also depicts a sequence of four diagrams along the bottom of FIG. 3B, where each diagram illustrates the magnetization directions 220, 222, 224 of the MTJ 102A at a particular time (t) and with a downward current direction (e−) during application of a negative version of the write pulse 350 (shown in FIG. 3A). The switching operation depicted by the sequence of four diagrams along the bottom of FIG. 3B proceeds in substantially the same manner as the switching operation depicted by the sequence of four diagrams along the top of FIG. 3B, except the current direction is downward, and the free layer magnetization direction 222 is switched from pointing upward to pointing downward.

Referring now to the sequence of diagrams shown along the bottom of FIG. 3B, a negative version of the write pulse 350 (shown in FIG. 3A) is applied to the MTJ 104A and operates, according to embodiments of the invention, to change the magnetization direction 222 of the free layer 208 from pointing up to pointing down, thereby writing to the MTJ 104A. The diagram at t=zero (0) ns depicts the magnetization directions 220, 222, 224 of the MTJ 102A at the WP-STT start time (shown in FIG. 3A). At the WP-STT start time, the magnetization direction 222 of the free layer 208 is anti-parallel with respect to the magnetization direction 220 of the bottom reference layer 204. Accordingly, the angle θ between the magnetization direction 222 and the magnetization direction 220 is substantially zero (0), and the bottom reference layer 204 initially produces either no or an insufficient amount of spin torque electrons to switch the polarity of the free layer magnetization direction 222. In contrast, at the WP-STT start time, the magnetization direction 222 of the free layer 208 is substantially perpendicular with respect to the substantially in-plane magnetization direction 224 of the top reference layer 224. Accordingly, the angle θ between the magnetization direction 222 and the magnetization direction 224 is about 90 degrees, and the top reference layer 212 initially produces a sufficient amount of spin torque electrons to initiate a process of switching the polarity of the free layer magnetization direction 222.

As the above-described process of switching the polarity of the free layer magnetization direction 222 continues, an angle θ begins to develop and continuously increases between the magnetization direction 222 and the magnetization direction 220. Accordingly, although at the WP-STT start time the bottom reference layer 204 produces either no or insufficient spin torque electrons to switch the magnetization direction 222, at some point into the above-described process of switching the polarity of the free layer magnetization direction 222, the bottom reference layer 204 begins to produce sufficient spin torque electrons to assist the above described process of switching the polarity of the free layer magnetization direction 222.

The diagram at t=0.9 ns depicts the magnetization directions 220, 222, 224 of the MTJ 102A just before the handoff time (t=one (1) ns, shown in FIG. 3A). At t=0.9 ns, the magnetization direction 222, under the influence of spin torque supplied by the top reference layer 212 and the bottom reference layer 204, has been switched to the position where it is substantially parallel with respect to the magnetization direction 224 of the top reference layer 212, as well as substantially perpendicular with respect to the fixed magnetization direction 220. Thus, at t=0.9 ns, the top reference layer 212 is attempting to maintain a parallel relationship between the magnetization direction 222 and the magnetization direction 224, and, at the same time, the bottom reference layer 204 is attempting to switch the magnetization direction 222 into an anti-parallel relationship between the magnetization direction 222 and the magnetization direction 220.

Passing from t=0.9 ns to t=1.1 ns, the MTJ 104A passes through the handoff time, which is t=one (1) ns (shown in FIG. 3A). At the handoff time, the influence of the top reference layer 212 on the free layer magnetization direction 222 is removed, and the primary influence on the direction of the free layer magnetization direction 222 is handed off to the fixed magnetization direction 220 of the bottom reference layer 204.

In a non-limiting embodiment of the invention, the influence of the top reference layer 212 on the free layer magnetization direction 222 can be removed according to the following example methodology. The top reference layer 212 has been configured with a low Tc (i.e., Curie temperature) of, for example, about 150 Celsius degrees. As previously noted herein, a material's Curie temperature is the temperature at which the material becomes nonmagnetic. At about t=one (1) ns, the Joule heating from the negative version of the write pulse 350 heats the MTJ 104A to above 150 Celsius, which makes the top reference layer 212 nonmagnetic. Hence, as depicted, at t=1.1 ns, the top reference layer 212 has been converted to nonmagnetic material, and the magnetization direction 224 of the top reference layer 212 has been removed.

At t=1.1 ns, the angle θ between the magnetization direction 222 and the magnetization direction 220 is about 90 degrees, and the bottom reference layer 204 now produces a sufficient amount of spin torque electrons to take over and complete the process of switching the polarity of the free layer magnetization direction 222. By t=10 ns, which is the end of the negative version of the write pulse 350, the process of switching the polarity of the free layer magnetization direction 222 has been completed, the free layer magnetization direction 222 is substantially anti-parallel with respect to the reference layer magnetization direction 220, and the write process is complete.

As previously noted herein, using the switching methodologies of the present invention, the inherent WER of known STT-MRAM configurations is overcome by providing, at the very start of the negative version of the write pulse 350, an angle θ between the free layer magnetization direction 222 and the magnetization direction 224 that produces from the very start of the write operation a sufficient amount of spin torque electrons to initiate a process of switching the polarity of the free layer magnetization direction 222. Because a primary cause of WER in known thermal STT-MRAM designs is that sine θ is either zero (0) or very close to zero (0) at the start of the spin torque switching, the switching methodologies of the present invention address and improve (i.e., decrease) the inherent WER of known STT-MRAM configurations.

Examples of suitable materials and configurations for the bottom reference layer 204 include, but are not limited to multilayers of Co and Ni, Co and Pt, Co and Pd, L10 alloys such as FePd, FePt, CoPd, and CoPt. In some embodiments of the invention, the reference layer (e.g., 204) also has a thin interface layer of CoFeB at the tunnel barrier (e.g., 206) MgO interface, separated from the rest of the reference layer (for example Co/Pt multilayer) by an ultrathin Ta or other refractory metal layer. The reference layer can also include a synthetic antiferromagnet, which includes two magnetic layers separated by a thin Ru spacer so that the two magnetic layers are aligned antiparallel.

Examples of suitable materials and configurations for the top reference layer 212 include, but are not limited to an alloy containing at least one of Fe, Co or Ni, for example CoFeB or CoFe.

Examples of suitable materials and configurations for the bottom tunnel barrier layer 206 include, but are not limited to MgOx, AlOx, and TiOx.

Examples of suitable materials and configurations for the top tunnel barrier layer 210 include, but are not limited to MgOx, AlOx, and TiOx.

The thicknesses of the respective layers of the MTJ 102A can vary according to design considerations. For example, the thicknesses of the layers of the MTJ 102A can be designed to have predetermined thicknesses, to have thicknesses within predetermined ranges, to have thicknesses having fixed ratios with respect to each other, or to have thicknesses based on any other consideration or combination of considerations in accordance with the functionality described herein. For example, the top reference layer 212 can have a thickness in a range from about 0.8 nm to about 10 nm. The bottom reference layer 204 can have a thickness in a range from about 2 nm to about 10 nm. The top tunnel barrier layer 210 can have a thickness in a range from about 0.5 nm to about 3 nm. The bottom tunnel barrier layer 206 can have a thickness in a range from about 0.5 nm to about 3 nm.

In addition to the MTJ 102A depicted in FIG. 2, alternative configurations include an MTJ where one or both of the reference layers 204, 212 are formed from a synthetic antiferromagnet.

Figure 4:
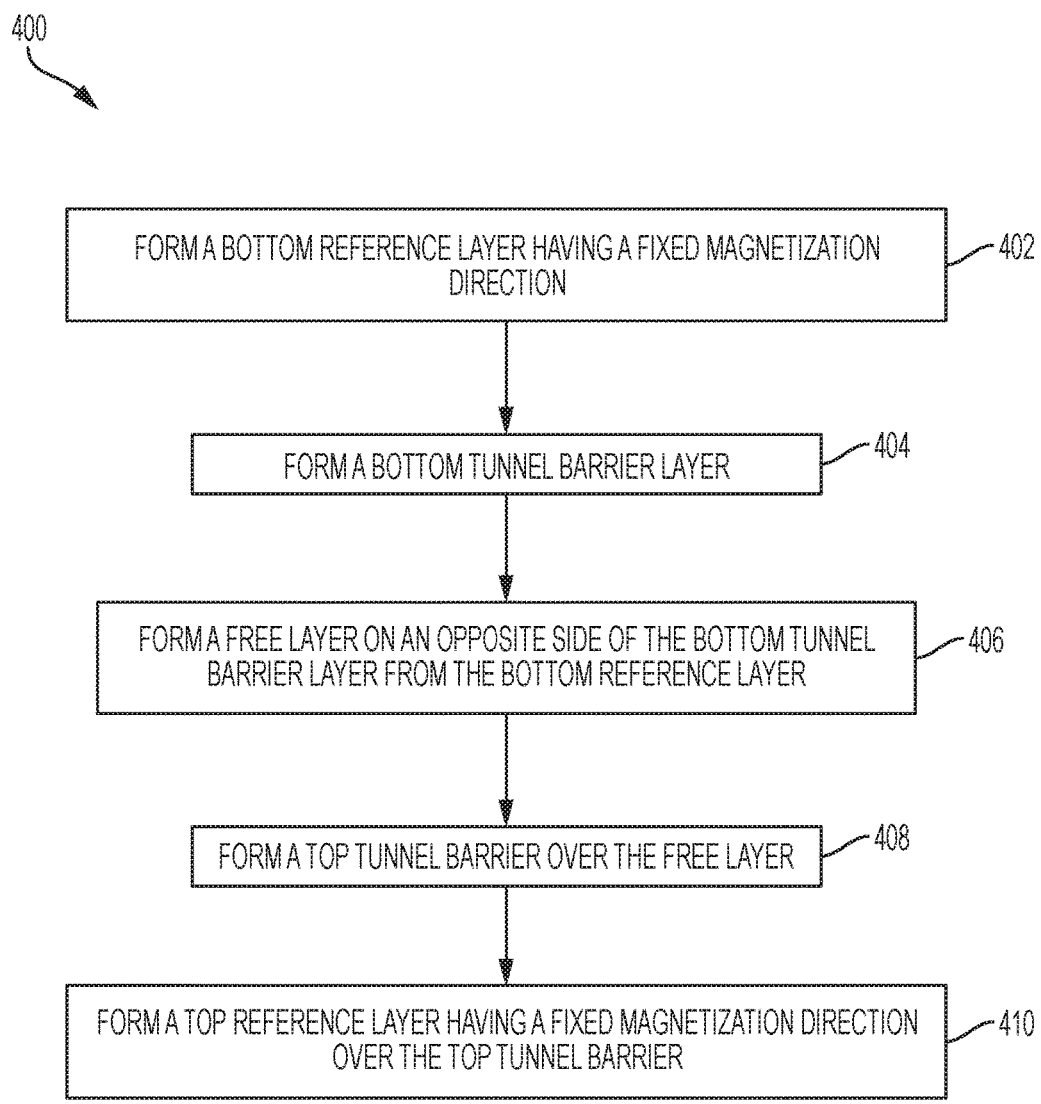
FIG. 4 depicts a flow diagram illustrating a method of forming a thermally-assisted spin torque MTJ according to embodiments of the invention.

FIG. 4 depicts a flow diagram illustrating a method 400 of forming the MTJ 102A according to embodiments of the invention. In block 402, the bottom reference layer 204 is formed. The bottom reference layer 204 can be formed, for example, by any suitable deposition, growth or other formation process. The bottom reference layer 204 can be formed of ferromagnetic material, including, but not limited to, multilayers of Co and Ni, Co and Pt, Co and Pd, L10 alloys such as FePd, FePt, CoPd, and CoPt. In some embodiments of the invention, the reference layer (e.g., 204) also has a thin interface layer of CoFeB at the tunnel barrier (e.g., 206) MgO interface, separated from the rest of the reference layer (for example Co/Pt multilayer) by an ultrathin Ta or other refractory metal layer. The reference layer can also include a synthetic antiferromagnet, which includes two magnetic layers separated by a thin Ru spacer so that the two magnetic layers are aligned antiparallel. In accordance with embodiments of the invention, the bottom reference layer 204 is formed and configured in a manner that provides the fixed magnetization direction 220.

In block 404, the bottom tunnel barrier layer 206 is formed. The bottom tunnel barrier layer 206 can be formed, for example, by any suitable deposition, growth or other formation process, and can be a non-conductive material, including, but not limited to, MgOx, AlOx, and TiOx. In accordance with embodiments of the invention, the bottom tunnel barrier 206 is configured to be thin enough to allow electrons (specifically, spin torque electrons) from the bottom reference layer 204 to quantum mechanically tunnel through the bottom tunnel barrier 206. The bottom tunnel barrier 206 is also configured to be thick enough to decouple the free layer 208 from the bottom reference layer 204 such that the magnetization direction 222 of the free layer 208 is free to flip back and forth.

In block 406, the free layer 208 is formed. The free layer 208 can be formed, for example, by any suitable deposition, growth or other formation process. The free layer 208 can be formed of ferromagnetic material, including, but not limited to, Fe, CoFe, and CoFeB. In accordance with embodiments of the invention, the free layer 208 is formed and configured in a manner that provides the switchable magnetization direction 222.

In block 408, the top tunnel barrier layer 210 is formed. The top tunnel barrier layer 210 can be formed, for example, by any suitable deposition, growth or other formation process, and can be a non-conductive material, including, but not limited to, MgOx, AlOx, and TiOx. In accordance with embodiments of the invention, the top tunnel barrier 210 is configured to be thin enough to allow electrons (specifically, spin torque electrons) from the top reference layer 212 to quantum mechanically tunnel through the top tunnel barrier 210. The top tunnel barrier 210 is also configured to be thick enough to decouple the free layer 208 from the top reference layer 212 such that the magnetization direction 222 of the free layer 208 is free to flip back and forth.

In block 410, the top reference layer 212 is formed. The top reference layer 212 can be formed, for example, by any suitable deposition, growth or other formation process. The top reference layer 212 can be formed of ferromagnetic material, including, but not limited to, Fe, CoFe, CoFeB. In some embodiments, the top reference layer 212 can be provided with a low Tc (i.e., Curie temperature) of about 150 Celsius degrees.

In accordance with embodiments of the invention, the top reference layer 212 is formed and configured in a manner that provides the fixed magnetization direction 224. In embodiments of the invention, the magnetization direction 224 is selected to provide an angle θ such that the value of sine θ is sufficiently large to produce spin torque electrons in the top reference layer 212 at the very start of the write operation. In embodiments of the invention, the magnetization direction 224 is selected to provide an angle θ such that the value of sine θ is sufficiently large to produce enough spin torque electrons in the top reference layer 212 to begin the process of switching the magnetization direction 222 of the free layer 208 at the very start of the write operation. In the embodiment shown in FIG. 2, the magnetization direction 224 is selected such that the angle θ is approximately 90 degrees. However, other directions can be selected for magnetization direction 224 as long as the selected direction for magnetization direction 224 provides a sine θ value that is sufficiently large to produce spin torque electrons in the top reference layer 212 at the very start of the write operation.

In accordance with embodiments of the invention, the top reference layer 212 can also be formed and configured in a manner that allows the stop reference layer 212 to hand off the primary influence on the free layer's magnetization direction 222 to the bottom reference/fixed layer 204. It is contemplated that handing the primary influence on the free layer's magnetization direction 222 off to the bottom reference/fixed layer 204 can be implemented in a variety of ways that would fall within the scope of the present invention. In some embodiments of the invention, the hand off can be executed in the following manner. The top reference/fixed layer 212 can be provided with a low Tc (i.e., Curie temperature) of about 150 Celsius degrees. As previously noted herein, a material's Curie temperature is the temperature at which the material becomes nonmagnetic or de-magnetized. When the write pulse is first applied, the Joule heating from the applied current has not generated enough heat to raise the temperature of the MTJ 102A above 150 Celsius. Therefore, up to the handoff time (e.g., the first one (1) ns of a ten (10) ns write pulse), the top reference/fixed layer 212 remains magnetic and applies spin torque electrons to the free layer 208 to efficiently move the free layer's magnetization direction 222 to be parallel with the top reference/fixed layer's magnetization direction 224. At the handoff time (e.g., about one (1) ns), the Joule heating from the applied current heats the MTJ 102A above 150 Celsius, which makes the top reference/fixed layer 212 nonmagnetic. When the top reference/fixed layer 212 is nonmagnetic, the generation of spin torque electrons in the top reference/fixed layer 212 ceases.

Thus it can be seen from the foregoing detailed description that the present invention provides magnetic tunnel junction (MTJ) memory cells having improved WER performance. Technical effects and benefits of the invention include providing a MTJ with a first reference layer that is configured to provide spin torque electrons at the very start of the write pulse and extending through an initial segment of the write pulse. The spin torque electrons produced by the first reference layer are sufficient to begin the process of switching the magnetization direction of the MTJ free layer. The MTJ further includes a second reference layer that is configured to take over the generation of spin torque electrons from the first reference layer at the end of the initial segment of the write pulse. The spin torque electrons produced by the second reference layer are sufficient to complete the process of switching the magnetization direction of the MTJ free layer. Using the switching methodologies of the present invention, the inherent WER of known STT-MRAM MTJ configurations is overcome by providing, at the very start of the write pulse, the first reference layer that is configured to produce from the very start of the write operation a sufficient amount of spin torque electrons to initiate a process of switching the direction of the free layer magnetization direction. Because a primary cause of WER in known thermal STT-MRAM designs is that there is an inherent delay before spin torque electrons are produced, the switching methodologies of the present invention address and improve (i.e., decrease) the inherent WER of known STT-MRAM configurations.

The terms "example" or "exemplary" are used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The phrase "direct contact" means that a first element, such as a first structure, and a second element, such as a second structure, are connected without any intermediary conducting, insulating or semiconductor layers at the interface of the two elements. It should be noted that the phrase "selective to," such as, for example, "a first element selective to a second element," means that a first element can be etched and the second element can act as an etch stop. The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof. For example, a composition, a mixture, process, method, article, or apparatus that comprises a list of elements is not necessarily limited to only those elements but can include other elements not expressly listed or inherent to such composition, mixture, process, method, article, or apparatus.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While a preferred embodiment has been described, it will be understood that those skilled in the art, both now and in the future, can make various improvements and enhancements which fall within the scope of the claims which follow.

What is claimed is:

1. A magnetic tunnel junction (MTJ) storage element comprising:
    a reference layer comprising a reference layer material having a fixed magnetization direction; and
    a free layer comprising a free layer material having a switchable magnetization direction;
    where the MTJ is configured to receive a write pulse having a write pulse duration;
    where the fixed magnetization direction is configured to form an angle between the fixed magnetization direction and the switchable magnetization direction;
    where the angle is sufficient to generate spin torque electrons in the reference layer material during the write pulse duration;
    where the reference layer material is configured to convert from magnetic to nonmagnetic during the write pulse duration.

2. The MTJ storage element of claim 1, where:
    the write pulse further includes a write-pulse and spin-transfer-torque (WP-STT) start time and a WP-STT start segment duration;
    the WP-STT start segment duration is less than the write pulse duration;
    the angle is sufficient to generate spin torque electrons in the reference layer material at the WP-STT start time; and
    the spin torque electrons generated in the reference layer material are sufficient to initiate a process of switching the switchable magnetization direction at the WP-STT start time.

3. The MTJ storage element of claim 1, where:
    the write pulse further includes a STT handoff time and a STT handoff segment duration;
    the STT handoff time is subsequent to the WP-STT start time; and
    the reference layer material is further configured to convert from magnetic to nonmagnetic at about the STT handoff time.

4. The MTJ storage element of claim 3, where the reference layer material is further configured to:
    no longer include the fixed magnetization direction after the reference layer material has converted from magnetic to nonmagnetic at about the STT handoff time; and
    no longer generate spin torque electrons after the reference layer material has converted from magnetic to nonmagnetic at about the STT handoff time.

5. The MTJ storage element of claim 4, where:
    subsequent to the STT handoff time, spin torque electrons are generated by at least one other region of the MTJ storage element; and
    the at least one other region is distinct from the reference layer material.

6. A magnetic tunnel junction (MTJ) storage element comprising:
    a first reference layer comprising a first reference layer material having a first fixed magnetization direction;
    a free layer comprising a free layer material having a switchable magnetization direction; and
    a second reference layer comprising a second reference layer material having a second fixed magnetization direction;
    where the MTJ is configured to receive a write pulse having a write-pulse and spin-transfer-torque (WP-STT) start time, a WP-STT start segment duration and a write pulse duration;
    where the WP-STT start segment duration is less than the write pulse duration;
    where the first fixed magnetization direction is configured to form a first angle between the first fixed magnetization direction and the switchable magnetization direction;
    where the first angle is sufficient to generate spin torque electrons in the first reference layer material during the write pulse duration;
    where the spin torque electrons generated in the first reference layer material are sufficient to initiate a process of switching the switchable magnetization direction at the WP-STT start time;
    where the second fixed magnetization direction is configured to form a second angle between the second fixed magnetization direction and the switchable magnetization direction;
    where the second angle is substantially insufficient to generate spin torque electrons in the second reference layer material at the WP-STT start time;
    where the first reference layer material is configured to convert from magnetic to nonmagnetic during the write pulse duration.

7. The MTJ storage element of claim 6, where:
    the write pulse further includes a STT handoff time and a STT handoff segment duration;

the STT handoff time is subsequent to the WP-STT start time; and the first reference layer material is further configured to convert from magnetic to nonmagnetic at about the STT handoff time.

8. The MTJ storage element of claim 7, where the first reference layer material is further configured to no longer include the first fixed magnetization direction after the first reference layer material has converted from magnetic to nonmagnetic at about the STT handoff time.

9. The MTJ storage element of claim 8, where the first reference layer material is further configured to no longer generate spin torque electrons after the first reference layer material has converted from magnetic to nonmagnetic at about the STT handoff time.

10. The MTJ storage element of claim 9, where subsequent to the STT handoff time, spin torque electrons are generated by the second reference layer material.

11. The MTJ storage element of claim 9 where subsequent to the STT handoff time, and subsequent to the spin torque electrons generated in the first reference layer material having initiated the process of switching the switchable magnetization direction, the second angle is substantially sufficient to generate spin torque electrons in the second reference layer material.

12. A magnetic tunnel junction (MTJ) storage element comprising:
a first reference layer comprising a first reference layer material having a first fixed magnetization direction and a predetermined Curie temperature;
a free layer comprising a free layer material having a switchable magnetization direction; and
a second reference layer comprising a second reference layer material having a second fixed magnetization direction;
where the MTJ storage element is configured to receive a write pulse having a write-pulse and spin-transfer-torque (WP-STT) start time, a WP-STT start segment duration and a write pulse duration;
where the WP-STT start segment duration is less than the write pulse duration;
where MTJ storage element and the write pulse are configured to initiate a process of imparting Joule heating to the MTJ storage element when the write pulse is applied to the MTJ storage element at the WP-STT start time;
where the Joule heating does not raise a temperature of the first reference layer above the predetermined Curie temperature during the WP-STT start segment duration;
where the first fixed magnetization direction is configured to form a first angle between the first fixed magnetization direction and the switchable magnetization direction;
where the first angle is sufficient to generate spin torque electrons in the first reference layer material at the WP-STT start time;
where the spin torque electrons generated in the first reference layer material are sufficient to initiate a process of switching the switchable magnetization direction at the WP-STT start time;
where the second fixed magnetization direction is configured to form a second angle between the second fixed magnetization direction and the switchable magnetization direction;

where the second angle is substantially insufficient to generate, at the WP-STT start time, spin torque electrons in the second reference layer material;
where the first reference layer material is configured to convert from magnetic to nonmagnetic during the write pulse duration.

13. The MTJ storage element of claim 12, where the second fixed magnetization direction is substantially in-plane with respect to a plane of the second reference layer.

14. The MTJ storage element of claim 12, where the second fixed magnetization direction becomes substantially perpendicular with respect to the switchable magnetization direction during the write pulse duration.

15. The MTJ storage element of claim 12, where:
the write pulse further includes a STT handoff time and a STT handoff segment duration;
the STT handoff time is subsequent to the WP-STT start time; and
the STT handoff time comprises when the Joule heating has raised the temperature of the first reference layer material above the predetermined Curie temperature to convert the first reference layer material from magnetic to nonmagnetic.

16. The MTJ storage element of claim 15, where the first reference layer material is further configured to no longer include the first fixed magnetization direction after the first reference layer material has converted from magnetic to nonmagnetic at about the STT handoff time.

17. The MTJ storage element of claim 16, where the first reference layer material is further configured to no longer generate spin torque electrons after the first reference layer material has converted from magnetic to nonmagnetic at about the STT handoff time.

18. The MTJ storage element of claim 17, where subsequent to the STT handoff time, spin torque electrons are generated by the second reference layer material.

19. The MTJ storage element of claim 17 where subsequent to the STT handoff time, and subsequent to the spin torque electrons generated in the first reference layer material having initiated the process of switching the switchable magnetization direction, the second angle is substantially sufficient to generate spin torque electrons in the second reference layer material.

20. A method of operating a magnetic tunnel junction (MTJ) storage element, the method comprising:
receiving a write pulse at the MTJ storage element to generate spin torque electrons;
where the MTJ storage element comprises a reference layer and a free layer;
where the reference layer comprises a reference layer material having a fixed magnetization direction;
where the free layer comprises a free layer material having a switchable magnetization direction;
where the write pulse comprises a write pulse duration;
where the fixed magnetization direction is configured to form an angle between the fixed magnetization direction and the switchable magnetization direction;
where the angle is sufficient to generate, based at least in part on receiving the write pulse, the spin torque electrons in the reference layer material at the WP-STT start time; and
initiating, based at least in part on the spin torque electrons generated in the reference layer material, a process of switching the switchable magnetization direction during the write pulse duration;

where the reference layer material is configured to convert from magnetic to nonmagnetic during the write pulse duration.

21. The method of claim 20, where:
the write pulse further includes a STT handoff time and a STT handoff segment duration; and
the STT handoff time is subsequent to the WP-STT start time;
the method further comprising converting the reference layer material from magnetic to nonmagnetic at about the STT handoff time.

22. The method of claim 21, where, subsequent to the reference layer material having converted from magnetic to nonmagnetic at about the STT handoff time, the reference layer material no longer includes the fixed magnetization direction.

23. The method of claim 22, where the reference layer material no longer generates spin torque electrons subsequent to the reference layer material having converted from magnetic to nonmagnetic at about the STT handoff time.

24. The method of claim 23, where:
subsequent to the STT handoff time, spin torque electrons are generated by at least one other region of the MTJ storage element; and
the at least one other region is distinct from the reference layer material.

25. A magnetic tunnel junction (MTJ) storage element comprising:
a first reference layer;
a second reference layer; and
a free layer between the first reference layer and the second reference layer;
where the first reference layer comprises a first reference layer material having a first fixed magnetization direction;
where the free layer comprises a free layer material having a switchable magnetization direction;
where the second reference layer comprises a second reference layer material having a second fixed magnetization direction;
where the MTJ storage element is configured to receive a write pulse having a write pulse duration;
where the first fixed magnetization direction is configured to form a first angle between the first fixed magnetization direction and the switchable magnetization direction;
where the first angle is sufficient to generate spin torque electrons in the first reference layer material during a first portion of the write pulse duration;
where the spin torque electrons generated in the first reference layer material are sufficient to initiate a process of switching the switchable magnetization direction during the first portion of the write pulse duration;
where the second fixed magnetization direction is configured to form a second angle between the second fixed magnetization direction and the switchable magnetization direction;
where, based at least in part on the switchable magnetization direction passing a predetermined threshold, the second angle becoming sufficient to generate spin torque electrons in the second reference layer material during a second portion of the write pulse duration; and
where the first reference layer material is configured to convert from magnetic to nonmagnetic during the write pulse duration.

* * * * *